United States Patent
Duan (10) Patent No.: US 9,460,670 B2
(45) Date of Patent: Oct. 4, 2016

(54) ARRAY SUBSTRATE, LIQUID CRYSTAL DISPLAY PANEL AND LIQUID CRYSTAL DISPLAY DEVICE

(71) Applicant: Beijing BOE Optoelectronics Technology Co., Ltd., Beijing (CN)

(72) Inventor: Xin Duan, Beijing (CN)

(73) Assignee: BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 56 days.

(21) Appl. No.: 13/994,966

(22) PCT Filed: Nov. 14, 2012

(86) PCT No.: PCT/CN2012/084574
§ 371 (c)(1),
(2) Date: Jun. 17, 2013

(87) PCT Pub. No.: WO2013/174109
PCT Pub. Date: Nov. 28, 2013

(65) Prior Publication Data
US 2014/0118657 A1    May 1, 2014

(30) Foreign Application Priority Data
May 24, 2012   (CN) .......................... 2012 1 0164588

(51) Int. Cl.
G09G 3/36      (2006.01)
G02F 1/1362    (2006.01)
H01L 27/12     (2006.01)

(52) U.S. Cl.
CPC ....... G09G 3/3614 (2013.01); G02F 1/136286 (2013.01); G09G 3/364 (2013.01);
(Continued)

(58) Field of Classification Search
CPC .......... G02F 1/136286; G09G 3/3614; G09G 3/364; G09G 3/3648; G09G 3/3644
USPC .............................. 349/33–37; 345/54, 92, 96
See application file for complete search history.

(56) References Cited

U.S. PATENT DOCUMENTS 5,436,635 A * 7/1995 Takahara et al. ................ 345/92
8,207,924 B2 * 6/2012 Horiuchi et al. ............... 345/88
(Continued)

FOREIGN PATENT DOCUMENTS

CN    19911546 A    7/2007
CN    101251660 A   8/2008
(Continued)

OTHER PUBLICATIONS

Second Office Action issued by the Chinese Patent Office for Chinese Patent Application No. 2012101645885 dated Sep. 5, 2014, 4pgs.
(Continued)

*Primary Examiner* — Dung Nguyen
(74) *Attorney, Agent, or Firm* — Ladas & Parry LLP (57) ABSTRACT

An array substrate, a liquid crystal display panel and a liquid crystal display device. The array substrate comprises data lines, gate lines and a pixel array provided on a base substrate. Each data line is connected with at least one type of sub-pixels in the pixel array, and sub-pixels of same type connected with a same data line have same polarity, and the sub-pixels connected with the same data line are connected with different gate lines, respectively.

14 Claims, 9 Drawing Sheets

(52) U.S. Cl.
CPC ......... *G09G 3/3648* (2013.01); *G09G 3/3607* (2013.01); *G09G 2300/0426* (2013.01); *G09G 2310/0218* (2013.01); *G09G 2310/06* (2013.01); *G09G 2330/021* (2013.01); *H01L 27/124* (2013.01)

(56) References Cited

U.S. PATENT DOCUMENTS

| | | | | |
|---|---|---|---|---|
| 8,279,217 | B2* | 10/2012 | Liu et al. | 345/214 |
| 8,502,948 | B2* | 8/2013 | Su et al. | 349/143 |
| 2007/0146518 | A1 | 6/2007 | Hong et al. | |
| 2008/0204434 | A1 | 8/2008 | Lee et al. | |
| 2010/0001935 | A1 | 1/2010 | Yang et al. | |
| 2012/0169688 | A1 | 7/2012 | Chen et al. | |
| 2012/0200615 | A1* | 8/2012 | Tsubata | 345/690 |
| 2014/0125644 | A1* | 5/2014 | Guo | 345/209 |

FOREIGN PATENT DOCUMENTS

| | | |
|---|---|---|
| CN | 101866086 A | 10/2010 |
| CN | 102263975 A | 11/2011 |
| CN | 102707525 A | 10/2012 |
| WO | 2011049106 A1 | 4/2011 |

OTHER PUBLICATIONS

English translation of Second Office Action issued by the Chinese Patent Office for Chinese Patent Application No. 2012101645885 dated Sep. 5, 2014, 3pgs.
International Search Report (Chinese language) issued by the International Searching Authority, rendered May 24, 2012, 17 pages.
The State Intellectual Property Office of the People's Republic of China (SIPO) (Chinese Language) Office Action issued on Apr. 2, 2014 by SIPO in Chinese Patent Application No. 201210164588.5; eight (8) pages.
English Translation of the State Intellectual Property Office of the People'S Republic of China (SIPO) Office Action issued on Apr. 2, 2014 by SIPO in Chinese Patent Application No. 201210164588.5; seven (7) pages.
English abstract of CN19911546(A) listed above, 26 pages.
English abstract of CN101251660(A) listed above, 25 pages.
English abstract of CN101866086(A) listed above, 26 pages.
English abstract of WO2011049106(A1) listed above, 20 pages.
English abstract of CN102707525(A) listed above, 24 pages.
English abstract of CN102263975(A) listed above,23 pages.
PCT International Preliminary Report on Patentability issued on Nov. 25, 2014 by the International Bureau of WIPO for International Application No. PCT/CN2012/084574, 13 pages.

* cited by examiner

FIG. 12

ARRAY SUBSTRATE, LIQUID CRYSTAL DISPLAY PANEL AND LIQUID CRYSTAL DISPLAY DEVICE

CROSS REFERENCE TO RELATED APPLICATIONS

This application is based on International Application No. PCT/CN2012/084574 filed on Nov. 14, 2012, which claims priority to Chinese National Application No. 201210164588.5, filed on May 24, 2012, the contents of which are incorporated herein by reference.

FIELD OF THE INVENTION

Embodiments of the present invention relate to an array substrate, a liquid crystal display panel and a liquid crystal display device.

BACKGROUND

Liquid crystal display (LCD) has advantages such as low power consumption, low radiation and low manufacturing cost, and has been widely used in a variety of electronic devices, such as monitors, televisions, mobile phones, digital cameras and other digital electronic devices. Thin film transistor liquid crystal display (TFT-LCD) is a mainstream flat panel display (FPD).

The principle of displaying for the liquid crystal display is to change grey scale of image displayed on a screen by deflection of the liquid crystal molecules. Upon the liquid crystal display panel being in normal work, in order to avoid the picture flicker which affects the quality of the display image, the liquid crystal molecules are driven generally in a polarity inversion (between positive and negative polarities) manner. The common polarity inversion manner of the pixel array is dot inversion.

Figure 1:
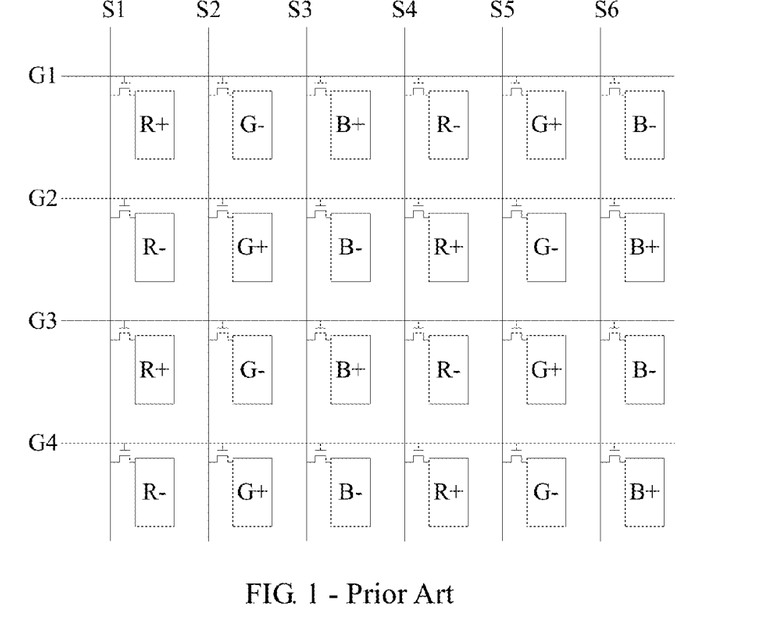
FIG. 1 is a structurally schematic diagram of a first array substrate in the prior art.
Figure 2:
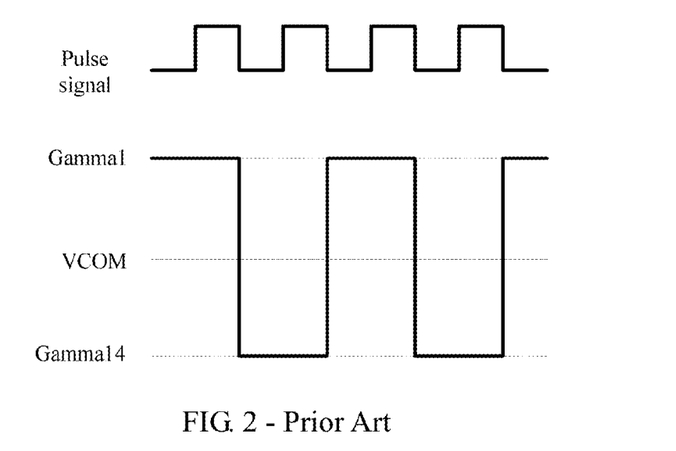
FIG. 2 is a diagram illustrating a voltage on a data line when a sub-pixel in the first array substrate in the prior art is inversed.

The dot inversion driving mode requires a pixel array on an array substrate of a liquid crystal display panel has its each sub-pixel (R sub-pixel or G sub-pixel or B sub-pixel) store a voltage with a polarity (i.e., the polarity of the sub-pixels) opposite to that of the adjacent sub-pixels at the upper, lower, right and left sides. The voltage stored by the sub-pixel being higher than the common electrode voltage (Vcom) is referred to a positive polarity, and the voltage stored by the sub-pixel being lower than the common electrode voltage (Vcom) is referred to a negative polarity. Under the dot inversion driving mode, the connection structure of the sub-pixel with the data line and the gate line in the array substrate is illustrated in FIG. 1, each sub-pixel in the pixel array of the array substrate is connected with data lines (S1-S6) and gate lines (G1-G4), respectively, through thin film transistors (TFT). In the pixel array, the sub-pixels located in the same horizontal position constitute a pixel row, and the sub-pixels located in the same vertical position constitute a pixel column. Each data line (S1-S6) is connected with one type of sub-pixels, for example, the data line S1 is connected with R sub-pixel of positive polarity and R sub-pixel of negative polarity, and the data line S2 is connected with G sub-pixel of positive polarity and G sub-pixel of negative polarity. Under the dot inversion mode, sub-pixels connected with each data line perform a switch between positive/negative bias voltages in every row scanning; but under the dot inversion mode, since the driving voltage of the data line is always switched at the largest amplitude, the frequent deflection of the liquid crystal molecules will cause loss of energy, thereby increasing the overall power consumption of the liquid crystal display panel. As illustrated in FIG. 2, in red displaying image, by taking the data line S2 as an example, the driving voltage of the data line S2 is always switched between Gamma1 (maximum gamma voltage) and Gamma14 (minimum Gamma voltage) in one clock cycle, and such a frequent deflection process will result in a large amount of loss of energy, thereby increasing the overall power consumption of the liquid crystal display panel.

Figure 3:
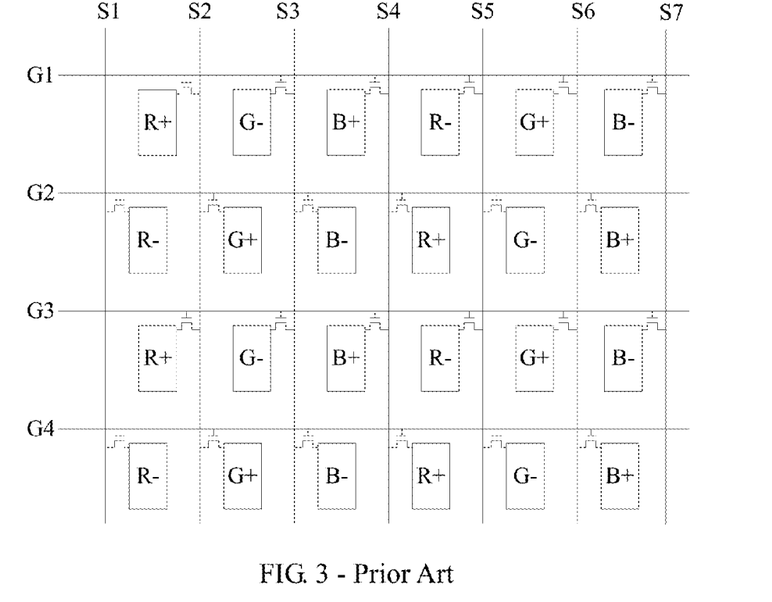
FIG. 3 is a structurally schematic diagram of a second array substrate in the prior art.
Figure 4:
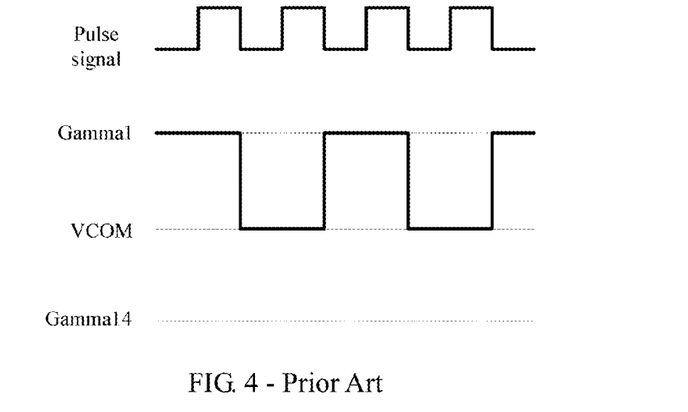
FIG. 4 is a diagram illustrating a voltage on a data line when a sub-pixel in the second array substrate in the prior art is inversed.

In order to solve the problems described above, a Z-inversion is proposed. Under the Z-inversion driving mode, it is required that the sub-pixels with the same polarity in two adjacent columns in the pixel array of the array substrate are connected with the same data line. Under the conventional Z-inversion driving mode, the connection structure of the sub-pixels with the data line and the gate line in array substrate is illustrated in FIG. 3. The data line S1 is connected with R sub-pixel with negative polarity in the first column, the data line S2 is connected with R sub-pixel and G sub-pixel with positive polarity in the first column and the second column, the data line S3 is connected with G sub-pixel and B sub-pixel with negative polarity in the second and third columns, . . . , the data line S7 is connected with B sub-pixel with negative polarity in the sixth column. Only the power consumption under the black and white displaying can be reduced by the Z-inversion mode. However, in the color displaying, the voltage on the data line is still subjected to a relatively large potential variation. As illustrated in FIG. 4, also by taking a red displaying image as an example, in one clock cycle, the driving voltage on the data line S2 is always switched between Gamma1 (Maximum gamma voltage) and Vcom (common electrode voltage). Such a frequent deflection process still cause loss of energy, thereby increasing the overall power consumption of the liquid crystal display panel.

In summary, when the existing connection structure of the sub-pixels with the gate lines and the gate lines in the array substrate is under the color displaying image, loss of energy will be caused, thereby increasing the overall power of the liquid crystal display panel consumption.

SUMMARY

An embodiment of the invention provides an array substrate, comprising: data lines, gate lines and a pixel array provided on a base substrate, wherein each data line is connected with at least one type of sub-pixels in the pixel array, and sub-pixels of same type connected with a same data line have same polarity, and the sub-pixels connected with the same data line are connected with different gate lines, respectively.

Another embodiment of the invention provides a liquid crystal display panel comprising the above mentioned array substrate.

Still another embodiment of the invention provides a liquid crystal display device comprising the above mentioned liquid crystal display panel.

In the array substrate according to the embodiment of the invention, each data line is connected with at least one type of sub-pixels, and the sub-pixels of the same type connected with the same data line have the same polarity and are connected with different gate lines. By changing the connection between the sub-pixels and the data lines and the gate lines in the array substrate, the energy loss can be significantly reduced when the array substrate is in the polarity inversion driving mode, even in a color displaying image, it is possible to greatly reduce the loss of energy, thereby reducing the overall power consumption of the liquid crystal display panel.

BRIEF DESCRIPTION OF THE DRAWINGS

In order to illustrate the technical solution of the embodiments of the invention more clearly, the drawings of the embodiments will be briefly described below; it is obvious that the drawings as described below are only related to some embodiments of the invention, but not limitative of the invention.

DETAILED DESCRIPTION

In order to make objects, technical details and advantages of the embodiments of the invention apparent, hereinafter, the technical solutions of the embodiments of the invention will be described in a clearly and fully understandable way in connection with the drawings related to the embodiments of the invention. It is obvious that the described embodiments are just a part but not all of the embodiments of the invention. Based on the described embodiments of the invention, those ordinarily skilled in the art can obtain other embodiment(s), without any inventive work, which should be within the scope sought for protection by the invention.

The embodiments of the invention can significantly reduce the energy loss in the polarity inversion driving mode by changing the connection of the sub-pixel with the data line and the gate line in the array substrate. Even in a color displaying image, it is possible to greatly reduce the loss of energy, thereby reducing the overall power consumption of the liquid crystal display panel.

An embodiment of the present invention provides an array substrate comprising:

Data lines (source lines), gate lines and a pixel array disposed on a base substrate. For example, sub-pixels in the pixel array are arranged into a two dimensional matrix along a row direction and a column direction. Each data line is connected with at least one type of sub-pixels in the pixel array, and the same type of sub-pixels connected with the same data line has the same polarity and is connected with different gate lines.

Each pixel unit in the pixel array according to the embodiment of the present invention includes at least three different types of sub-pixels, i.e., a red (R) sub-pixel, a green (G) sub-pixel, and a blue (B) sub-pixel.

The data lines and the gate lines on the array substrate of the embodiment of the invention cross with each other so as to define a plurality of pixel regions, and each pixel region includes a sub-pixel and a switching element (e.g., a thin film transistor). A gate electrode of the TFT is connected with the gate line of the array substrate, and a drain electrode of the TFT is connected with the data line of the array substrate, and a drain electrode of the TFT is connected with the sub-pixel of the array substrate. In the array substrate according to the embodiment of the present invention, all sub-pixels can be arranged in a specific way (for example, a two-dimensional matrix manner), thereby forming the pixel array.

Hereinafter, the array substrate according to the embodiment of the invention is described in further detail by connection with the drawings. It should be noted that the following embodiments are described with the types of the sub-pixel including an R sub-pixel, a G sub-pixel and a B sub-pixel as an example, but the invention can be applied to other cases with different types of sub-pixels, which are not described one by one; In addition, for convenience of describing the structure of the embodiment of the invention, the drawings provided in the embodiment of the invention are described with specific numbers of data lines, gate lines, and sub-pixels, however, these numbers are not limitation to the numbers of the data lines, the gate lines and the sub-pixels in the array substrate; the numbers of the data lines, the gate lines and the sub-pixels in the array substrate are set according to a design requirement of the product.

First Embodiment the array substrate according to the embodiment of the invention comprises: a plurality of data lines, a plurality of gate lines and a pixel array disposed on a base substrate, each sub-pixel in the pixel array being connected with the data lines and gate lines through a switching element, respectively; all sub-pixels in a same pixel column in the pixel array of the array substrate are of the same type, and the sub-pixels in two adjacent pixel columns have different types, and a polarity of each sub-pixel is opposite to that of the adjacent sub-pixels in a same pixel row and the adjacent sub-pixels in the same pixel column.

Figure 5:
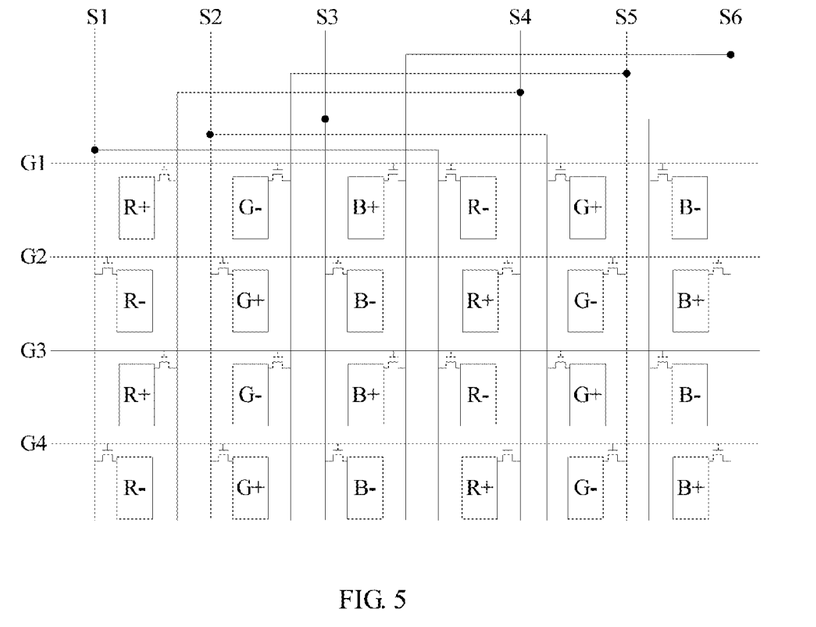
FIG. 5 is a structurally schematic diagram of an array substrate according to a first embodiment of the invention.

As illustrated in FIG. 5, the array substrate according to the first embodiment of the present invention has a pixel array of 4 rows and 6 columns, the sub-pixels in the first pixel column are R sub-pixels, the sub-pixels in the second pixel column are G sub-pixels, and the sub-pixels in the third pixel column are B sub-pixels, and the sub-pixel in the fourth pixel column are R sub-pixels, and so on.

The polarity of each sub-pixel is opposite to that of the adjacent sub-pixels in a same pixel row and the adjacent sub-pixels in the same pixel column. In the pixel array illustrated in FIG. 5, the G sub-pixel in the second row and in the second column has a positive polarity (G+), the sub-pixels adjacent thereto in the same pixel row (i.e., the second row) are a negative R sub-pixel (R−) located in the second row and in the first column and a negative B sub-pixel (B−) in the second row and in the third column, and the sub-pixels adjacent thereto in the same pixel column (i.e., the second column) are a negative G sub-pixel (G−) in the first pixel row and in the second pixel column and a negative G sub-pixel (G−) in the third pixel row and in the second pixel column.

In the present embodiment, each data line is connected with the sub-pixels of the same type and with the same polarity in at least one pixel column, and the sub-pixels connected with the same data line is connected with different gate lines. As for the first array substrate illustrated in FIG. 5, the data line S1 is connected with the negative R sub-pixel, the data line S2 is connected with the positive G sub-pixel, the data line S3 is connected with the negative B sub-pixel, the data line S4 is connected with the positive R sub-pixel, the data line S5 is connected with the negative G sub-pixel, and the data line S6 is connected with the positive B sub-pixel; the gate lines G1 to G4 are respectively connected with the first pixel row, the second pixel row, the third pixel row and the fourth pixel row in the pixel array.

Preferably, each data line is connected with the sub-pixels of the same type and with the same polarity in two pixel columns.

As for first array substrate illustrated in FIG. 5, the data line S1 is connected with the negative R sub-pixel (R−) in the first pixel column and the R− in the fourth pixel column, the data line S2 is connected with the positive G sub-pixel (G+) in the second pixel column and the G+ in the fifth pixel column, the data line S3 is connected with the negative B sub-pixel (B−) in the third pixel column and the B− in the sixth pixel column, the data line S4 is connected with the positive R sub-pixel (R+) in the first pixel column and the R+ in the fourth pixel column, the data line S5 is connected with the negative G sub-pixel (G−) in the second pixel column and the G− in the fifth pixel column, and the data line S6 is connected with the positive B sub-pixel (B+) in the third pixel column and the B+ in the sixth pixel column.

Figure 6:
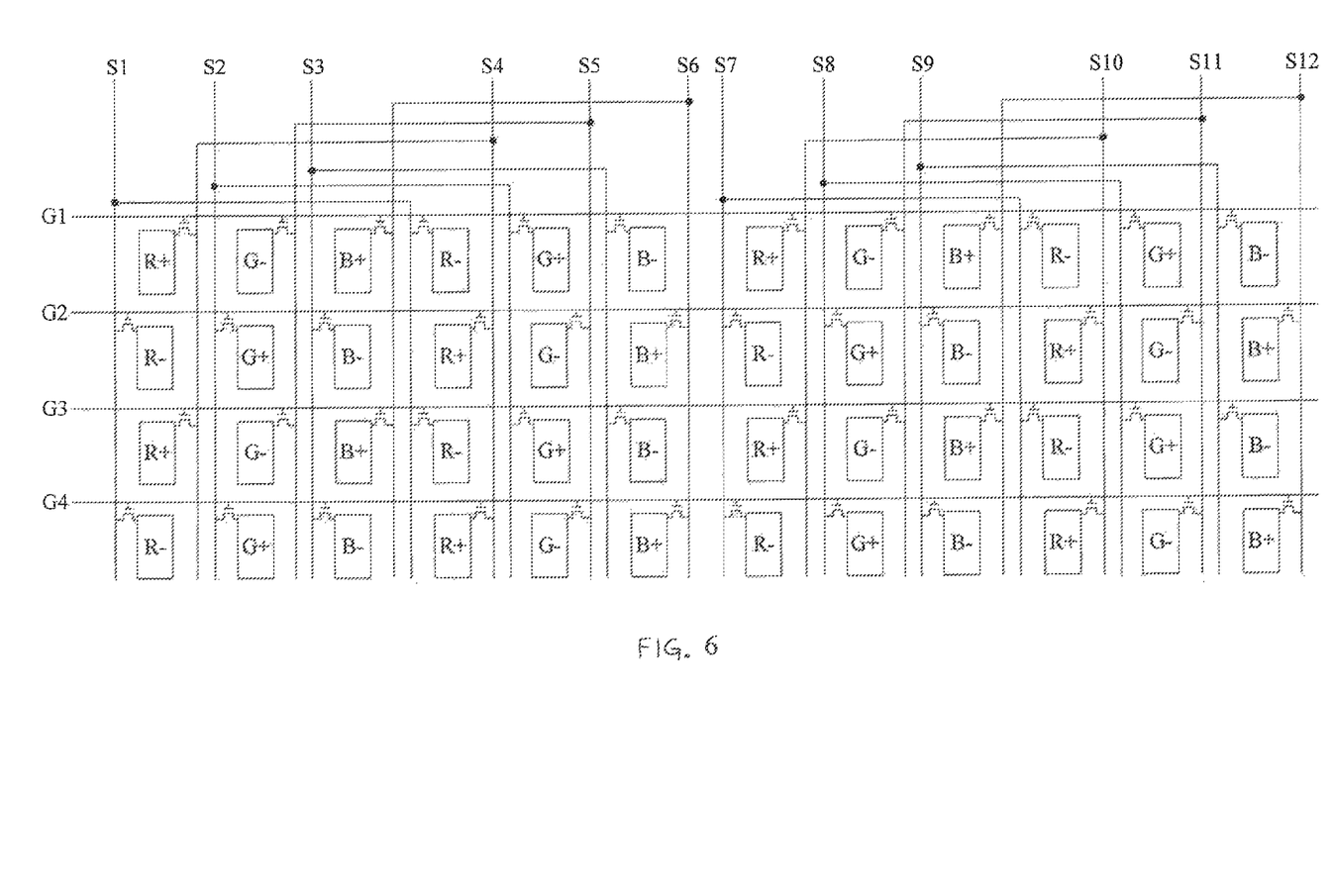
FIG. 6 is a structurally schematic diagram of an array substrate according to a second embodiment of the invention.

As for a second array substrate illustrated in FIG. 6, the pixel array is of 4 rows and 12 columns. The data lines S1 is connected with the R− in the first pixel column and the R− in the fourth pixel column, the data line S2 is connected with the G+ in the second pixel column and the G+ in the fifth pixel column, the data line S3 is connected with the B− in the third pixel column and the B− in the sixth pixel column, and the data lines S4 is connected with the R+ in the first pixel column and the R+ in the fourth pixel column, the data line S5 is connected with the G− in the second pixel column and the G− in the fifth pixel column, the data line S6 is connected with the B+ in the third pixel column and the B+ in the sixth pixel column, and so on.

It should be noted that, as long as it can be ensured that the same type of sub-pixels connected with the same data line are connected with different gate lines, the same data line can be connected with any two pixel columns. For example, the data lines S1 in FIG. 6 can also be connected with the R+ in the first pixel column and the R+ in the tenth pixel column; however, the data line S1 in FIG. 6 cannot be connected with the R+ in the first pixel column and the R+ in the seventh pixel column.

It should be noted, the embodiments illustrated in FIGS. 5 and 6 are described with an example in which the same data line is connected with the sub-pixels with the same polarity in two pixel columns of the same type, however, the invention can also be similarly applied into the case in which the same data line is connected with the sub-pixels with the same polarity in three or more pixel columns of the same type, which will not be described in detail.

Preferably, in the embodiment, each data line is connected with the sub-pixels of the same type and with the same polarity in two pixel columns, and all of the sub-pixels connected with the data line are connected with different gate lines.

By taking the first array substrate illustrated in FIG. 5 as an example, the voltage on the data line upon the sub-pixels being inverted will be described.

When a timing controller (TCON) connected with the first array substrate performs an internal data processing such as chroma control, the displaying image will be converted into corresponding transistor-transistor logic (TTL) digital signal in accordance with each sub-pixel; before the TTL digital signal is output, and it is converted to a mini-low voltage differential signal (mini-LVDS) format, that is, in accordance with the sequence needed to be loaded on the sub-pixels on the LCD panel, each of the digital signal is mapping in accordance with the format of the mini-LVDS, and the processed data signal, a control signal and a clock signal are transmitted to a source driver IC. The TCON is used to perform chroma control and timing control, and has the functions such as data inversion and pixel polarity inversion.

As for the first array substrate illustrated in FIG. 5, TCON adopts a data mapping as illustrated in Table 1, which is described with a resolution of 1366*768 as an example.

TABLE 1

|  | 1st Line | | | | 2nd Line | | | | |
| --- | --- | --- | --- | --- | --- | --- | --- | --- | --- |
| LV0 | 2R | 4R | 6R | ... 1366R | 1R | 3R | 5R | ... 1365R | |
| LV1 | 2G | 4G | 6G | ... 1366G | 1G | 3G | 5G | ... 1365G | |
| LV2 | 2B | 4B | 6B | ... 1366B ⇨ | 1B | 3B | 5B | ... 1365B | ⇨ ... |
| LV3 | 1R | 3R | 5R | ... 1365R | 2R | 4R | 6R | ... 1366R | |
| LV4 | 1G | 3G | 5G | ... 1365G | 2G | 4G | 6G | ... 1366G | |
| LV5 | 1B | 3B | 5B | ... 1365B | 2B | 4B | 6B | ... 1366B | |

As illustrated in Table 1, the LV0-LV5 denote mini-LVDS signals of six pairs of differential data lines S1-S6. In Table 1, the contents in each table cell indicates the data transmitted in the mini-LVDS signal line, the data in one column of table cells represent the content needed to be displayed upon being transmitted to the Driver IC through the TCON at same time. The 1st Line represents the data required be loaded on the data lines when the LCD panel scanning the first pixel row, the 2nd Line represents the data required be loaded on the data lines when the LCD panel scanning the second pixel row, and so on; wherein the number portion in each table cell indicates the position of the sub-pixels in the pixel array.

By using the Data Mapping in Table 1, when the TFT corresponding to the first pixel row is turned on, the data lines S1 to S6 sequentially corresponds to the first column of data in Table 1, i.e., 2R, 2G, 2B, 1R, 1G, 1B, and so on. The voltage signal is loaded into each sub-pixel connected with the data lines in the first pixel row through the data lines on the array substrate.

Figure 7:
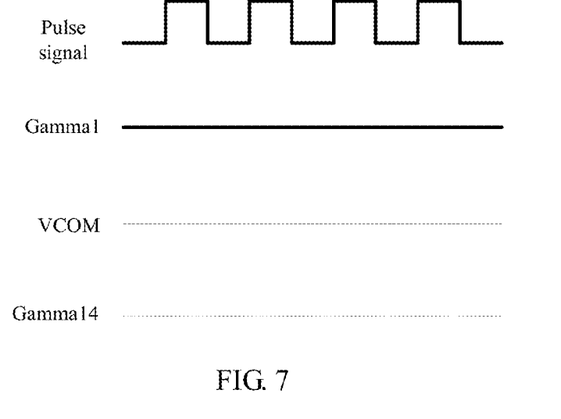
FIG. 7 is a diagram illustrating a voltage on a data line when a sub-pixel in the array substrate according to the first embodiment of the invention is inversed.

When the sub-pixels in the first array substrate illustrated in FIG. 5 are inverted, the voltage change of the data line is illustrated in FIG. 7. Also by taking a red displaying image as an example, in one clock cycle, the driving voltage on the data line S2 can be maintained at Gamma1 voltage within a relatively longer time, which greatly reduces the loss of energy, thereby reducing the overall power consumption of the liquid crystal display.

Simultaneously, comparing the first array substrate illustrated in FIG. 5 and the array substrate in the background illustrated in FIG. 3, in case of the same resolution, the first array substrate illustrated in FIG. 5 employs six data lines, and the array substrate illustrated in FIG. 3 employs seven data lines, i.e. requiring an additional data line. Usually, the number of the channels of the Driver IC corresponds to the number of the displaying pixels, and the connection method illustrated in FIG. 5 does not require the additional data line, i.e., the method can use a traditional Driver IC, while the background art illustrated in FIG. 3 requires at least one additional data channel, which needs to modify the traditional Driver IC so as to increase the number of channels. Therefore, the first array substrate illustrated in FIG. 5 enhances the versatility of the Source Driver IC.

For example, in the embodiment illustrated in FIG. 5 or 6, the pixel array includes three types of sub-pixels of different colors. All sub-pixels in the same pixel column in the pixel array are of the same type, and the sub-pixels in two adjacent pixel columns are of different types. In each pixel row, three different types of sub-pixels are sequentially and repeatedly arranged. Each sub-pixel has a polarity different from that of the adjacent sub-pixels in the row and column directions.

As illustrated in FIG. 5 or 6, every six consecutive columns of sub-pixels constitute a group, and six data lines are provided correspondingly in each group. Among the six data lines, the first data line S1 is connected with the sub-pixels having the first polarity in the first pixel column and the fourth pixel column, while the fourth data line S4 is connected with the sub-pixels having a second polarity opposite to the first polarity in the first pixel column and the fourth pixel column; the second data line is connected with the sub-pixels having the second polarity in the second pixel column and the fifth pixel column, while the fifth data line is connected with the sub-pixels having the first polarity opposite to the second polarity in the second pixel column and the fifth pixel column; the third data line is connected with the sub-pixels having the first polarity in the third pixel column and the sixth pixel column, while the sixth data line is connected with the sub-pixels having the second polarity opposite to the first polarity in the third pixel column and the sixth pixel column.

For example, in the embodiment illustrated in FIG. 5 or FIG. 6, each pixel row is assigned to a gate line. That is, each gate line is connected with all sub-pixels in each pixel row (connected with the gate electrode of the thin film transistor in each sub-pixel).

The array substrate according to the present embodiment, however, is not limited to three different types of sub-pixels, however, the number of the types may be an odd number greater than or equal to 3. For example, the pixel array comprises H types of sub-pixels of different colors, H is an odd number greater than or equal to 3. H different types of sub-pixels in each pixel row are sequentially and repeatedly arranged, and each sub-pixel has a polarity different from that of the adjacent sub-pixels in the row direction and the column direction.

Every 2H consecutive columns of sub-pixels constitute a group, and 2H data lines are provided correspondingly in each group. Among the 2H data lines, the sub-pixels in the ath column and the (a+H)th column with different polarities are connected with the two different data lines, respectively, where "a" is a positive integer and 1≤a≤H. For example, H is 3 or 5.

Second Embodiment

The arrangement of the pixel array in the array substrate in the present embodiment is the same as that in the first embodiment. In addition, the array substrate further comprises at least three additional special data lines. The number of the additional special data lines is equal to the number of the types of the sub-pixels. For example, if the sub-pixels include three types (R sub-pixel, G sub-pixel and B sub-pixel), then three additional data lines are required. As another example, if the sub-pixels include four types (R sub-pixel, G sub-pixel, B sub-pixel, and W sub-pixel), then four additional data lines are required. The embodiment is described by taking a case including R sub-pixel, G sub-pixel and B sub-pixel as an example, and other cases are similar and will not be repeated here.

The three special data lines added onto the array substrate additionally are a first special data line, a second special data line, and a third special data line, respectively. The first special data line, the second special data line, and the third special data line are respectively connected with the different types of sub-pixels in the same pixel unit, and the sub-pixels of the same type in all the pixel units which are connected with the first special data line, the second special data line and the third special data line have the same polarity, and the sub-pixels in all the sub-pixels which are connected with the first special data line, the second special data line and the third special data line are located in the first pixel column, the second pixel column, and the third pixel column.

Figure 8:
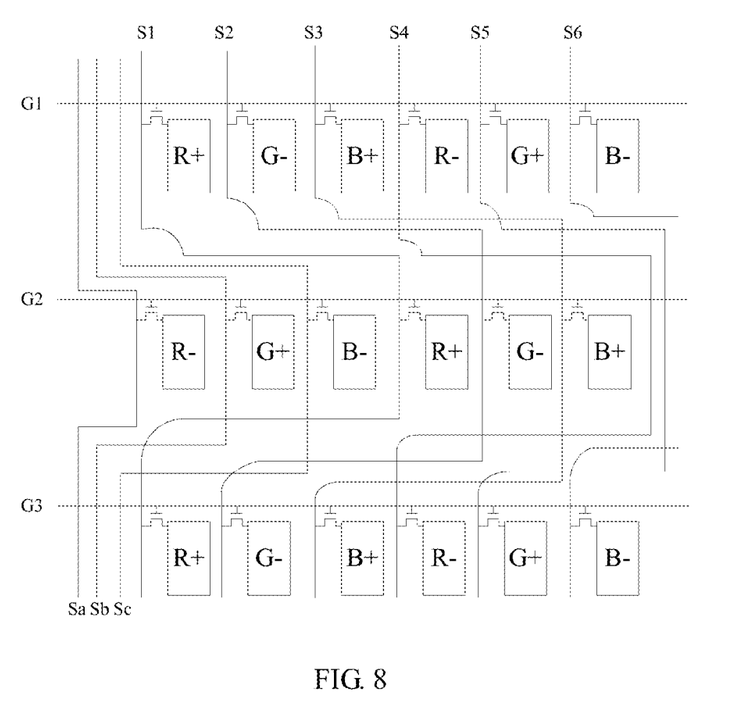
FIG. 8 is a structurally schematic diagram of an array substrate according to a third embodiment of the invention.

A third array substrate according to the embodiment of the invention is illustrated in FIG. 8, and it comprises: data lines S1-S6, gate lines G1-G3, and a pixel array (3×6), wherein each sub-pixel in the pixel array is connected with the data lines S1-S6, and the gate lines G1-G3 through a switching element.

In the pixel array of the third array substrate, all sub-pixels in the same pixel column are of the same type, and the sub-pixels in any two adjacent pixel columns are of different types, as illustrated in FIG. 8. The sub-pixels in the first pixel column are R sub-pixels, and the sub-pixels in the second pixel column are G sub-pixels, the sub-pixels in the third pixel column are B sub-pixels, and so on; any sub-pixel in the pixel array of the third array substrate has a polarity opposite to the polarity of adjacent sub-pixels in the same pixel row and in the same pixel column in the pixel array.

The third array substrate further includes three additional special data lines, as illustrated in FIG. 8, i.e., a first special data lines Sa, a second special data line Sb, and a third special data line Sc. The first special data line Sa is connected with the R− in the first pixel column and in the second pixel row of the pixel array, the second special data line Sa is connected with the G+ in the second pixel column and in the second pixel row of the pixel array, and the third special data line Sc is connected with the B− in the third pixel column and in the second pixel row. The sub-pixels located in the same pixel row and in three adjacent pixel columns form one pixel unit. As illustrated in FIG. 8, the R+, G− and B+ located in the first pixel row and in the first pixel column, the second pixel column, and the third pixel column form a pixel unit, the R+, G− and B+ located in the second pixel row and in the first pixel column, the second pixel row, and the third pixel column form a pixel unit, and so on.

Alternatively, the first special data line Sa in the array substrate can also be connected with R+ in the first pixel column of the pixel array, the second special data line Sb can also be connected with the G− in the second pixel column, and the third special data line Sc can also be connected with the B+ in third pixel column.

The connection between the data lines S1-S6 and the gate lines G1-G3 and each sub-pixel in the pixel array in the third array substrate is similar to that illustrated in FIG. 5, which is not repeated here.

The Data Mapping corresponding to the third array substrate of FIG. 8 is illustrated in Table 2, which will be described by still taken a resolution of 1366*768 as an example.

TABLE 2

| | 1st Line | | | | | | 2nd Line | | | | |
|---|---|---|---|---|---|---|---|---|---|---|---|
| LV0 | DUMMY | 2R | 4R | ... | 1364R | 1366R | 1R | 3R | 5R | ... | 1365R | DUMMY |
| LV1 | DUMMY | 2G | 4G | ... | 1364G | 1366G | 1G | 3G | 5G | ... | 1365G | DUMMY |
| LV2 | DUMMY | 2B | 4B | ... | 1364B | 1366B ⇒ | 1B | 3B | 5B | ... | 1365B | DUMMY ⇒ ... |
| LV3 | 1R | 3R | 5R | ... | 1365R | DUMMY | 2R | 4R | 6R | ... | 1366R | DUMMY |
| LV4 | 1G | 3G | 5G | ... | 1365G | DUMMY | 2G | 4G | 6G | ... | 1366G | DUMMY |
| LV5 | 1B | 3B | 5B | ... | 1365B | DUMMY | 2B | 4B | 6B | ... | 1366B | DUMMY |

It should be noted that the various physical quantities in Table 2 have the same meaning as those in Table 1, which will not be repeated here. A dummy (null) signal is added in front of the display signal, as for the array substrate illustrated in FIG. 8, when the sub-pixels in the first pixel row are loaded with signals, since the data lines Sa-Sc are not connected with the sub-pixels in the first pixel row, therefore a dummy (null) signal should be inserted before the effective data for displaying. The above data processing is completed during a stage for data mapping inside TCON.

Figure 9:
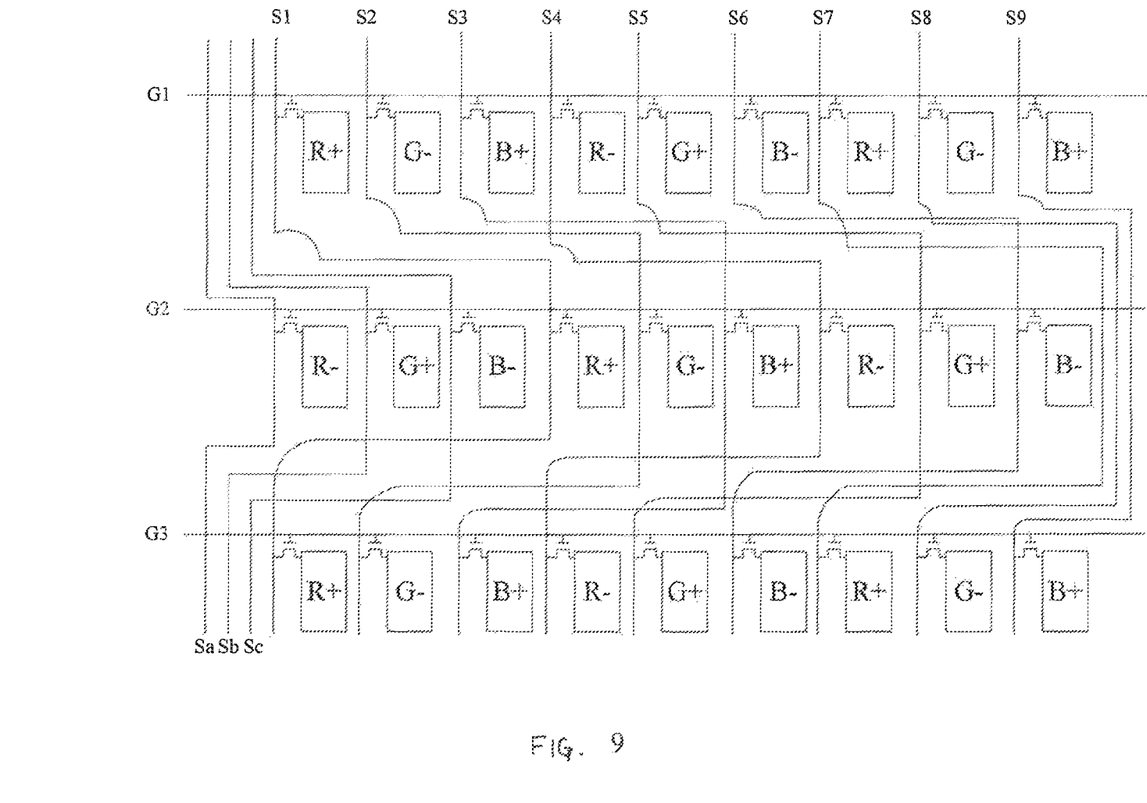
FIG. 9 is a structurally schematic diagram of an array substrate according to a fourth embodiment of the invention.

A fourth array substrate according to the embodiment of the invention is illustrated in FIG. 9, and it comprises: data lines S1-S9, gate lines G1-G3, and a pixel array (3×9), wherein each sub-pixel in the pixel array is connected with the data lines S1-S9 and the gate lines G1-G3 through switching elements, respectively.

In the pixel array of the fourth array substrate illustrated in FIG. 9, all sub-pixels in the same pixel column are of the same type, and the sub-pixels in any two adjacent pixel columns in the third array substrate are of different types; any sub-pixel has a polarity opposite to the polarity of the adjacent sub-pixels in the same pixel row and in the same pixel column in pixel array.

As illustrated in FIG. 9, the fourth array substrate further comprises three additional data lines, i.e. a first special data line Sa, a second special data line Sb and a third special data line Sc, wherein the first special data line Sa is connected with the R− in the first pixel column and in the second pixel row of the pixel array, the second special data line Sb is connected with the G+ in the second pixel column and in the second pixel row, and the third special data line Sc is connected with the B− in the third pixel column and in the second pixel row. Alternatively, in the present embodiment, the first special data lines Sa can also be connected with the R+ in the first pixel column and in the first pixel row of the pixel array, the second special data line Sb can also be connected with the G− in second pixel column and in the first pixel row, and the third special data line Sc can also be connected with the B+ in the third pixel column and in the first pixel row.

The connection between the data lines S1-S9 and the gate lines G1-G3 and each sub-pixel in the pixel array in the fourth array substrate is similar with that illustrated in FIG. 5, which is not repeated here.

Preferably, in the array substrate of the present embodiment, each data line (not including the additional special data lines) is connected with the sub-pixels of the same type and with the same polarity in two pixel columns, and all of the sub-pixels connected with the data line are connected with different gate lines.

Specifically, the three adjacent pixel columns respectively containing the R sub-pixels, the G sub-pixels and the B sub-pixels are set to one group, and sequentially a plurality of pixel columns are divided into a plurality of groups. In this case, at least two pixel columns connected with the same data line may be pixel columns with the same sub-pixel type in two adjacent groups, as illustrated in the array substrate in FIG. 8 or 9, and may also be pixel columns with the same sub-pixel type in the groups which are not adjacent with each other.

The embodiments illustrated in FIGS. 8 and 9 are described by taking a case in which one data line is connected with the sub-pixels with the same polarity in two pixel columns of the same type as an example. Other cases in which one data line is connected with sub-pixels of the same polarity in three and more of pixel columns of the same type is similar to that in FIGS. 8 and 9, which will not be repeated here.

For example, in the embodiment illustrated in FIG. 8 or 9, the pixel array includes three types of sub-pixels of different colors. In the pixel array, all sub-pixels in the same pixel column are of the same type, and the sub-pixels in two adjacent pixel columns are of different types. In each pixel row, the sub-pixels of three different types are arranged sequentially and repeatedly. Each sub-pixel has a polarity different from the polarity of adjacent sub-pixels in the row and column directions.

For example, the total number of the data lines can be M, among the first data line to the (M−3)th data line, the Nth data line is connected with the sub-pixels of the same polarity in the Nth column and the (N+3)th column, wherein M is a positive integer greater than 3, and N<M−3.

For example, in the embodiment illustrated in FIG. 8 or 9, the array substrate can further includes three additional data lines, these three additional data lines are connected with the sub-pixels, which are not connected with the first to third data lines, in the first to third pixel columns.

For example, in the embodiment illustrated in FIG. 8 or 9, each pixel row is assigned to a gate line. That is, each gate line is connected with all sub-pixels in each pixel row (connected with the gate electrode of the thin film transistor in the sub-pixel).

The array substrate according to the present embodiment, however, is not limited to three different types of sub-pixels, but the number of types may be an odd number greater than or equal to 3. For example, the pixel array comprises H types of sub-pixels of different colors, H is an odd number greater than or equal to 3. In each pixel row, H different types of sub-pixels are sequentially and repeatedly arranged, and the polarity of each sub-pixel has a polarity different from that of adjacent sub-pixels in the row direction and in the column direction.

For example, the total number of data lines is M, from the first data line to the (M−H)th data line, the Nth data line is connected with the sub-pixels of the same polarity in the Nth column and the (N+H)th column, where M is a positive integer greater than H, N is a positive integer and N<M−H.

For example, the array substrate may further include H additional data lines which are connected with the sub-pixels not connected with the first to the Hth data lines in the first to the Hth columns.

The array substrate according to the second embodiment of the present invention adds three additional data lines on the basis of the existing array substrate (the array substrate as illustrated in FIG. 1) for being connected with the R, G and B three pixels, respectively; Comparing with the connection in the array substrate according to the first embodiment, its advantages is in that the array wiring region can be more easily achieved, and the conventional Z-Inversion Data Mapping can be compatible.

Third Embodiment

The present embodiment provides an array substrate, comprising: data lines, gate lines and a pixel array disposed on a base substrate, each sub-pixel in the pixel array is connected with the data line and the gate line, respectively, through a switching element. The arrangement of the pixel array in the array substrate according to the present embodiment is different from that in the first embodiment. In the pixel array according to the present embodiment, all of the sub-pixels in the same pixel row are of the same type, and each pixel column includes at least one pixel unit, wherein each pixel unit includes at least an R sub-pixel, a G sub-pixel and a B sub-pixel.

In the array substrate according to the present embodiment, each data line is connected with at least one pixel unit in at least one pixel column, and the sub-pixels of the same type in all the pixel units connected with the same data line have the same polarity.

Figure 10:
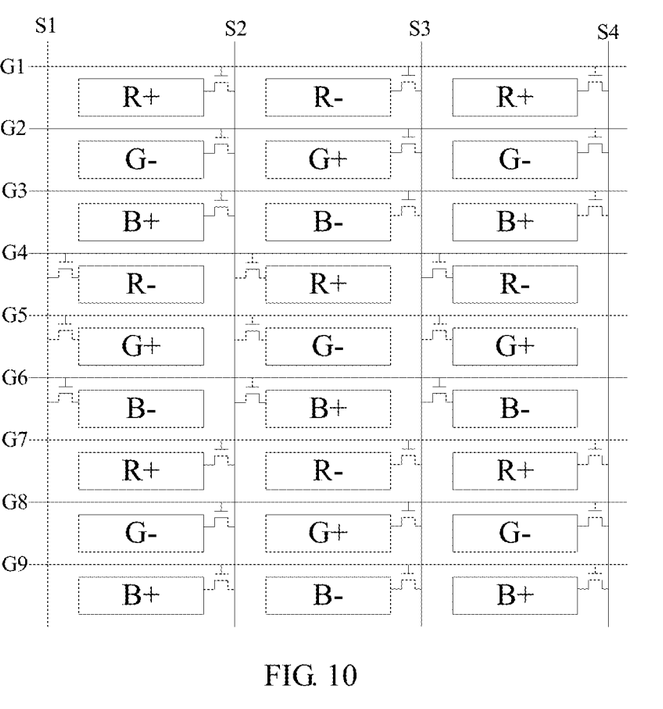
FIG. 10 is a structurally schematic diagram of an array substrate according to a fifth embodiment of the invention.

As illustrated in FIG. 10, a fifth array substrate comprises: data lines S1-S4, gate lines G1-G9 and a pixel array, wherein the pixel array is of 9 rows and 3 columns. The sub-pixels in the first pixel row are R sub-pixels, the sub-pixels in the second pixel row are G sub-pixels, the sub-pixels in the third pixel row are B sub-pixels, and the sub-pixels in the fourth pixel row are R sub-pixels, and so on. The first pixel column includes three pixel units, the first pixel unit includes R+ in the first pixel column and the first pixel row, G− in the first pixel column and in the second pixel row and B+ in the first pixel column and in the third pixel row; the second pixel unit includes R− in the first pixel column and in the fourth pixel row, G+ in the first pixel column and in the fifth pixel rows, and B− in the first pixel column and in the sixth pixel row; the third pixel unit includes R+ in the first pixel column and in the seventh pixel row, G− in the first pixel column and in the eighth pixel row, B+ in the first pixel column and in the ninth pixel row.

In the present embodiment, the data line S1 is connected with the second pixel unit in the first pixel column; the data line S2 is connected with the first pixel unit and the third pixel unit in the first pixel column, and the second pixel unit in the second pixel column, and so on; wherein the sub-pixels of the same type in all pixel units connected with the same data line have the same polarity. As illustrated in FIG. 10, in the three pixel units connected with the data line S2, the R sub-pixels are positive, the G sub-pixels are negative and the B sub-pixels are positive.

Preferably, each data line is connected with the pixel units, in which the sub-pixels of the same type have the same polarity, in two pixel columns; as illustrated in FIG. 10, the data line S2 is connected with the pixel units in the first pixel column and the second pixel column, and the data line S3 is connected with the pixel units in the second pixel column and the third pixel columns.

It should be noted that, the two pixel columns connected with the same data line can be adjacent pixel columns, but can also be non-adjacent pixel columns.

The data mapping corresponding to the fifth array substrate of FIG. 10 is illustrated in Table 3.

TABLE 3

| | 1st Line | | | 2nd Line | | | 3rd Line | | |
|---|---|---|---|---|---|---|---|---|---|
| LV0 | DUMMY | ... 1362R | | DUMMY | ... 1362G | | DUMMY | ... 1362B | |
| LV1 | 1R | ... 1363R | | 1G | ... 1363G | | 1B | ... 1363B | |
| LV2 | 2R | ... 1364R | ⇨ | 2G | ... 1364G | ⇨ | 2B | ... 1364B | ⇨ |
| LV3 | 3R | ... 1365R | | 3G | ... 1365G | | 3B | ... 1365B | |
| LV4 | 4R | ... 1366R | | 4G | ... 1366G | | 4B | ... 1366B | |
| LV5 | 5R | ... DUMMY | | 5G | ... DUMMY | | 5B | ... DUMMY | |
| | 4th Line | | | 5th Line | | | 6th Line | | |
| | 1R | ... 1363R | | 1G | ... 1363G | | 1B | ... 1363B | |
| | 2R | ... 1364R | | 2G | ... 1364G | | 2B | ... 1364B | |
| ⇨ | 3R | ... 1365R | ⇨ | 3G | ... 1365G | ⇨ | 3B | ... 1365B | |
| | 4R | ... 1366R | | 4G | ... 1366G | | 4B | ... 1366B | |
| | 5R | ... DUMMY | | 5G | ... DUMMY | | 5B | ... DUMMY | |
| | 6R | ... DUMMY | | 6G | ... DUMMY | | 6B | ... DUMMY | |

Each of physical quantities in Table 3 has the same meaning as that in Table 1 and 2, which will not be repeated here. Because the arrangement of the pixel array in the array substrate illustrated in FIG. 10 is different from that of the array substrates in FIG. 5 and FIG. 8, the sub-pixels in the same pixel row in the pixel array illustrated in FIG. 10 are of the same type, for example, the first pixel row are R sub-pixels, the second pixel row are G sub-pixels, the third pixel row are B sub-pixels, and so on. Therefore, during the data mapping inside the TCON, all of the R sub-pixel data in the first pixel row are mapped to data bits corresponding to the first row of the mini-LVDS, and so on.

In the array substrate according to the embodiment, the pixel column in the pixel array adopts a manner in which the R sub-pixel, the G sub-pixel, the B sub-pixel are sequentially arranged in vertical direction, and three adjacent sub-pixels (the R sub-pixel, the G sub-pixel and the B sub-pixel) as a whole are connected to the data lines. By changing the arrangement of the pixel array, the array wiring difficulty can be reduced, and the number of the source output channels can be decreased, thereby largely reducing the cost.

Fourth Embodiment

The present embodiment provides an array substrate with an arrangement of the pixel array the same as that in the first embodiment, but each sub-pixel in the pixel array and the data lines, gate lines are connected in different ways.

Each data line is connected with at least one pixel unit in at least one pixel column, and the sub-pixels of the same type in all of the pixel units connected with the same data line have the same polarity. Each pixel row includes at least one pixel unit, wherein each pixel unit includes an R sub-pixel, a G sub-pixel and a B sub-pixel.

Figure 11:
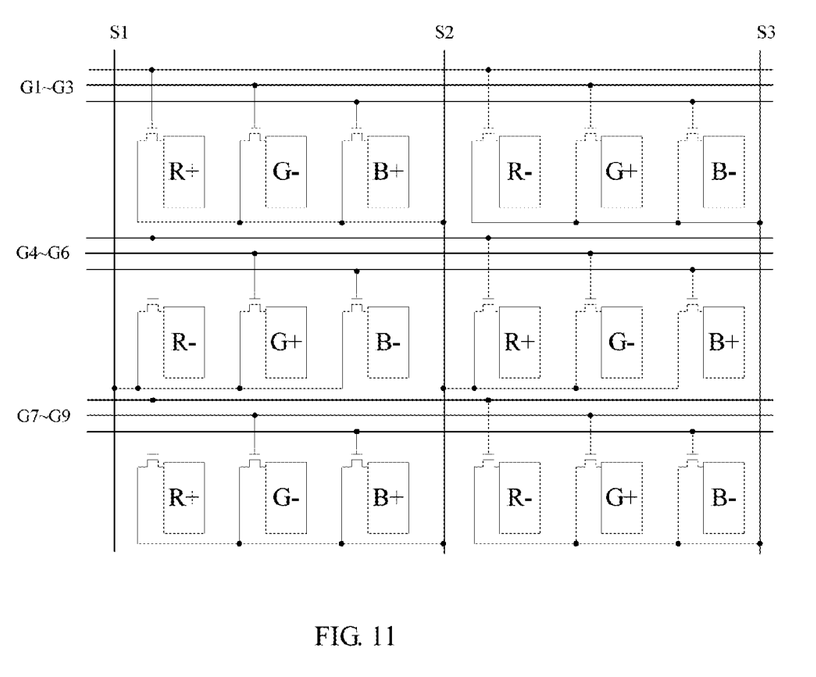
FIG. 11 is a structurally schematic diagram of an array substrate according to a sixth embodiment of the invention.

FIG. 11 illustrates a sixth array substrate, comprising: data lines S1-S3, gate lines G1-G9 and a pixel array, wherein the pixel array is of 3 rows and 6 columns. The sub-pixels in the first pixel column are R sub-pixels, the sub-pixels in the second pixel column are G sub-pixels, the sub-pixels in the third pixel column are B sub-pixels, and the sub-pixels in the fourth pixel column are R sub-pixels, and so on. The first pixel row includes two pixel units, and the first pixel unit includes R+ in the first pixel row and in the first pixel column, G− in the first pixel row and in the second pixel column and B+ in the first pixel row and in the third pixel column; the second pixel unit includes R− in the first pixel row and in the fourth pixel column, G+ in the first pixel row and in the fifth pixel column and B− in the first pixel row and in the sixth pixel column, and so on.

In the present embodiment, the data line S1 is connected with the first pixel unit in the second pixel row; the data line S2 is connected with the first pixel unit in the first pixel row, the second pixel unit in the second pixel row, and the first pixel unit in the third pixel row; the data line S3 is connected with the second sub-pixel group in the first pixel row and the second sub-pixel group in the third pixel row. The sub-pixels of the same type in all the pixel units connected with each data line have the same polarity. As illustrated in FIG. 11, in all the pixel units connected with the data line S2, the R sub-pixels are positive, the G sub-pixel are negative and the B sub-pixels are positive.

Preferably, each data line is connected with pixel units, in which the sub-pixels of the same type have the same polarity, in two pixel columns. As illustrated in FIG. 11, the data line S2 is connected with the pixel units in the first pixel row, the second pixel row and the third pixel row, the data line S3 is connected with the pixel units in the first pixel row and the third pixel row.

It should be noted that the two pixel rows connected with the same data line can be the adjacent pixel row, and can also be non-adjacent pixel rows.

The array substrate according to the present embodiment adopts a Data mapping same as that of the array substrate according to the third embodiment, as illustrated in Table 3, which is not repeated here.

In the array substrate according to the present embodiment, the pixel rows of the pixel array adopts a manner in which the R sub-pixel, the G sub-pixel, and the B sub-pixel are sequentially arranged in a horizontal direction, and three adjacent sub-pixels (the R sub-pixel, the G sub-pixel, and the B sub-pixel) as a whole are connected with the data line, which further reduces the array wiring difficulty while reduces the number of source output channels, thereby largely reducing the cost.

In the embodiment of the invention, the types of the sub-pixel includes at least R sub-pixel, B sub-pixel and G sub-pixel, and the types of the sub-pixel may further include other types such as W (white) sub-pixel, Y (yellow) sub-pixel.

Hereinafter, by taking the connection manner of FIG. 5 as an example, the array substrate with the pixel array comprising the R sub-pixel, the B sub-pixel, the G sub-pixel and the W sub-pixel is described. It should be noted that, other cases in which the pixel array includes other types of sub-pixels or more sub-pixel types are similar to this case, which will not be described in detail. In the cases that the pixel array includes other types of sub-pixels or more sub-pixel types, the connection between each sub-pixel and the data lines and gate lines is similar to the above-described embodiment, which will not be described in detail.

Figure 12:
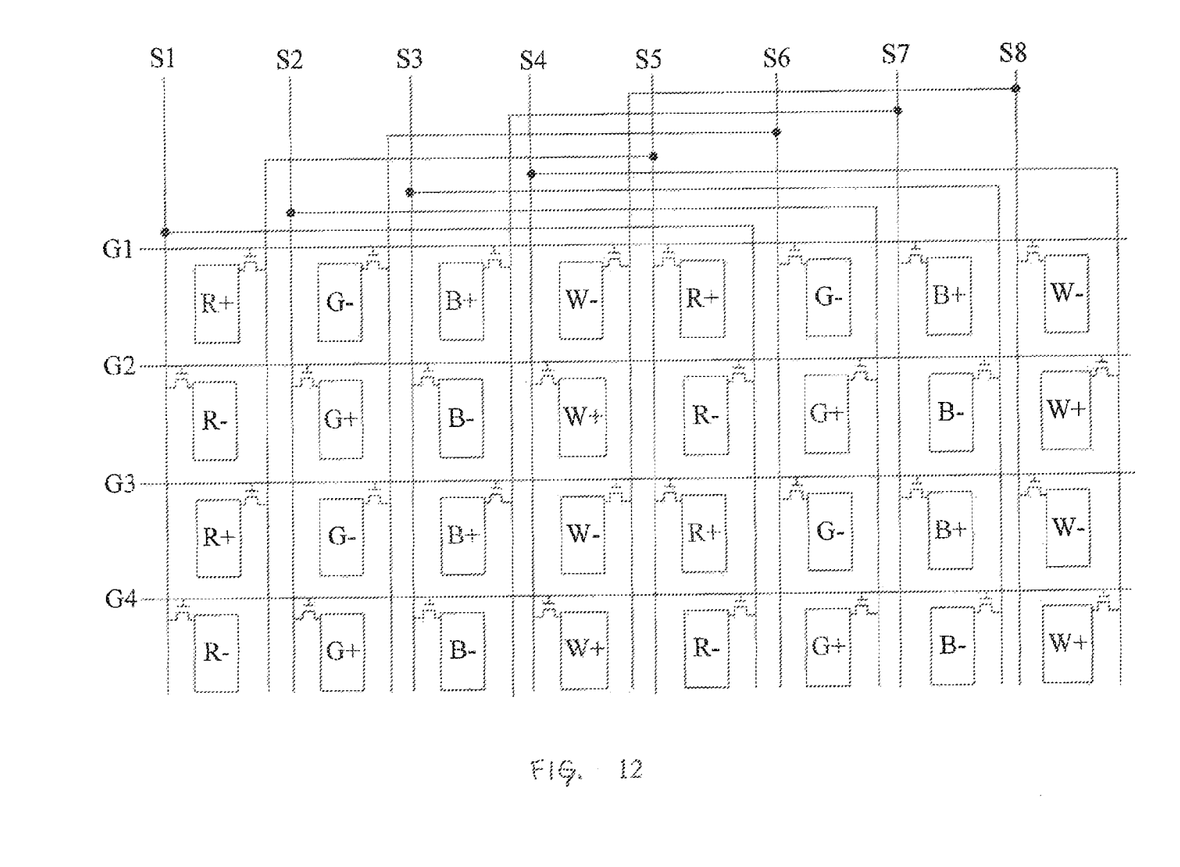
FIG. 12 is a structurally schematic diagram of an array substrate according to a seventh embodiment of the invention.

As illustrated in FIG. 12, as for the seventh array substrate according to the embodiment of the present invention, the pixel array is of 4 rows and 8 columns. The sub-pixels in the first pixel column are R sub-pixels, the sub-pixels in the second pixel column are G sub-pixels, the sub-pixels in the third pixel column are B sub-pixels, the sub-pixels in the fourth pixel column are W sub-pixels, and the sub-pixels in the fifth pixel column are R sub-pixels, and so on.

Each sub-pixel in the pixel array has a polarity opposite to the polarity of the adjacent sub-pixels in the same pixel row and in the same pixel column in the pixel array. As illustrated in the pixel array of FIG. 12, the G sub-pixel in the second pixel row and in the second pixel column has a positive polarity (G+), the sub-pixels adjacent thereto and located in the same pixel row (i.e., the second pixel row) is an R sub-pixel located in the second pixel row and in the first pixel column having a negative polarity (R−) and a B sub-pixel located in the second pixel row and the third pixel column having a negative polarity (B−), and the sub-pixels adjacent thereto and located in the same pixel column (i.e., the second pixel column) is a G sub-pixel located in the first pixel row and the second pixel column having a negative polarity (G−) and a G sub-pixel located in the third pixel row and in the second pixel column having a negative polarity (G−).

In the present embodiment, each data line is connected with the sub-pixels of the same type and with the same polarity in at least one pixel column, and the sub-pixels connected with the same data line are connected with different gate lines. As for the array substrate illustrated in FIG. 12, the data line S1 is connected with the negative R sub-pixel, the data line S2 is connected with the positive G sub-pixel, the data line S3 is connected with the negative sub-pixel, the data line S4 is connected with the positive W sub-pixel, the data line S5 is connected with the positive R sub-pixel, the data line S6 is connected with the negative G sub-pixel, the data line S7 is connected with the positive B sub-pixel, the data line S8 is connected with the negative W sub-pixel; the gate lines G1 to G4 are respectively connected with the first pixel row, the second pixel row, the third pixel row, and the fourth pixel row in the pixel array.

Preferably, each data line is connected with the sub-pixels of the same type and with the same polarity in two pixel columns.

As for the array substrate illustrated in FIG. 12, the data line S1 is connected with the negative R sub-pixel (R−) in the first pixel column and the R− in the fifth pixel column, the data line S2 is connected with the positive G sub-pixel (G+) in the second pixel column and the G+ in the sixth pixel column, the data line S3 is connected with the negative B sub-pixel (B−) in the third pixel column and the B− in the seventh pixel column, the data line S4 is connected with positive W sub-pixel (W+) in the fourth pixel column and the W+ in the eighth pixel column, and so on.

An embodiment of the invention provides a liquid crystal display panel, comprising any array substrate as mentioned above.

An embodiment of the invention provides a liquid crystal display device, comprising the above-described liquid crystal display panel.

Although the preferred embodiments of the invention have been described, any other modification and change can be made on these embodiments once those skilled in the art know the basic inventive concept. Therefore, the appended claims are intended to be construed as including the preferred embodiments and all variations and modifications falling into the scope of the invention.

In the array substrate according to the embodiment of the invention, each data line is connected with at least one type of sub-pixels, and the sub-pixels of the same type connected with the same data line have the same polarity and are connected with different gate lines. By changing the connection between the sub-pixels and the data lines and the gate lines in the array substrate, the energy loss can be significantly reduced when the array substrate is in the polarity inversion driving mode, even in a color displaying image, it is possible to greatly reduce the loss of energy, thereby reducing the overall power consumption of the liquid crystal display panel.

The foregoing are merely exemplary embodiments of the invention, but not used to limit the protection scope of the invention. The protection scope of the invention is defined by attached claims.

What is claimed is:

1. An array substrate, comprising:
data lines, gate lines and a pixel array provided on a base substrate,
wherein each data line is connected with at least one type of sub-pixels in the pixel array, and sub-pixels of same type connected with a same data line have same polarity, and the sub-pixels connected with the same data line are connected with different gate lines, respectively,
wherein at least one of the data lines is connected with the sub-pixels of same type and with same polarity in at least two pixel columns,
wherein the pixel array comprises H types of sub-pixels of different colors, and H is an odd number greater than or equal to 3;
wherein, in each pixel row, the H different types of sub-pixels are sequentially and repeatedly arranged;
wherein each sub-pixel has a polarity different from that of other sub-pixels adjacent thereto in the row direction or the column direction, and
wherein the data lines have a total number of M, from the first data line to the (M−H)th data line, the Nth data line is connected with the sub-pixels with same polarity in the Nth column and the (N+H)th column, wherein M is a positive integer greater than H, N is a positive integer and N<M−H.

2. The array substrate according to claim 1, wherein all sub-pixels in a same pixel column in the pixel array are of same type, and the sub-pixels in two adjacent pixel columns are of different types.

3. The array substrate according to claim 2, wherein each of the data lines is connected with the sub-pixels of same type and with same polarity in at least one pixel column.

4. The array substrate according to claim 3, wherein each of the data lines is connected with the sub-pixels of same type and with same polarity in two pixel columns.

5. The array substrate according to claim 1, wherein the types of the sub-pixels comprises at least an R sub-pixel, a G sub-pixel, and a B sub-pixel.

6. The array substrate according to claim 1, further comprising H additional data lines, the H additional data lines are connected with the sub-pixels, which are not connected with the first to the Hth data lines, in the first to the Hth column.

7. The array substrate according to claim 1, wherein every successive 2H column of sub-pixels constitute a group, and 2H data lines are provided correspondingly for each group, wherein in the 2H data lines, the sub-pixels with different polarities in the ath column and the (a+H)th column are respectively connected with two different data lines, wherein a is a positive integer and 1≤a≤H.

8. The array substrate according to claim 1, wherein H is 3 or 5.

9. The array substrate according to claim 1, wherein each gate line is connected with all sub-pixels in each pixel row.

10. An array substrate, comprising:
data lines, gate lines and a pixel array provided on a base substrate,
wherein each data line is connected with at least one type of sub-pixels in the pixel array, and sub-pixels of same type connected with a same data line have same polarity, and the sub-pixels connected with the same data line are connected with different gate lines, respectively,
wherein each of the data lines is connected with at least one pixel unit in at least one pixel row, and the sub-pixels of same type in all the pixel units connected with the same data line have same polarity; wherein each pixel unit comprises at least an R sub-pixel, a G sub-pixel and a B sub-pixel,
wherein each of the data lines is connected with all of the R sub-pixel, G sub-pixel and the B sub-pixel in the at least one pixel unit.

11. The array substrate according to claim 10, wherein each of the data lines is connected with the pixel units, in which the sub-pixels of same type have same polarity, in two pixel columns.

12. The array substrate according to claim 10, wherein all sub-pixels in a same pixel column in the pixel array are of same type, and the sub-pixels in two adjacent pixel columns are of different types.

13. An array substrate, comprising:
data lines, gate lines and a pixel array provided on a base substrate, wherein each data line is connected with at least one type of sub-pixels in the pixel array, and sub-pixels of same type connected with a same data line have same polarity, and the sub-pixels connected with the same data line are connected with different gate lines, respectively, wherein all sub-pixels in a same pixel row in the pixel array are of same type, sub-pixels in two adjacent pixel rows are of different types, and each pixel column comprises at least one pixel unit, wherein each pixel unit comprises at least an R sub-pixel, a G sub-pixel and a B sub-pixel, and wherein each of the data lines is connected with all sub-pixels of at least one pixel unit in at least one pixel column, and the sub-pixels of same type in all the pixel units connected with the same data line have same polarity.

14. The array substrate according to claim 13, wherein each of the data lines is connected with the pixel units, in which the sub-pixels of same type have same polarity, in two pixel columns.

* * * * *